(12) United States Patent
Tsujino et al.

(10) Patent No.: US 9,386,687 B2
(45) Date of Patent: Jul. 5, 2016

(54) ELECTRONIC COMPONENT HOUSING PACKAGE AND ELECTRONIC APPARATUS

(71) Applicant: KYOCERA Corporation, Kyoto-shi, Kyoto (JP)

(72) Inventors: Mahiro Tsujino, Kyoto (JP); Yoshiki Kawazu, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 112 days.

(21) Appl. No.: 14/367,566

(22) PCT Filed: Dec. 20, 2012

(86) PCT No.: PCT/JP2012/083064
§ 371 (c)(1),
(2) Date: Jun. 20, 2014

(87) PCT Pub. No.: WO2013/094684
PCT Pub. Date: Jun. 27, 2013

(65) Prior Publication Data
US 2014/0345929 A1    Nov. 27, 2014

(30) Foreign Application Priority Data

Dec. 20, 2011  (JP) ................................ 2011-277987

(51) Int. Cl.
*H05K 1/16* (2006.01)
*H05K 1/02* (2006.01)
(Continued)

(52) U.S. Cl.
CPC ............ *H05K 1/0213* (2013.01); *H01L 23/057* (2013.01); *H01L 23/49861* (2013.01);
(Continued)

(58) Field of Classification Search
CPC ........... H05K 7/10; H05K 7/14; H05K 7/142; H01L 21/50; H01L 23/02; H01L 23/04; H01L 23/08; H01L 23/16; H01L 23/28; H01L 23/31; H01L 23/36; H01L 31/0203
USPC ......... 174/260, 524, 528, 535, 538, 541, 557, 174/560, 565, 562; 257/434, 680, 777; 438/64; 361/283.4; 29/827
See application file for complete search history.

(56) References Cited

U.S. PATENT DOCUMENTS 4,035,046 A * 7/1977 Kloth ............................. 439/71
4,784,974 A * 11/1988 Butt ............................... 29/827
(Continued)

FOREIGN PATENT DOCUMENTS

JP    9-275145 A    10/1997
JP   11-312751 A    11/1999
(Continued)

OTHER PUBLICATIONS

International Search Report, PCT/JP2012/083064, Feb. 21, 2013, 1 pg.
(Continued)

*Primary Examiner* — Xiaoliang Chen
(74) *Attorney, Agent, or Firm* — Volpe and Koenig, P.C.

(57) ABSTRACT

While it is necessary for an electronic component housing package to be provided with numerous wiring conductors, phase differences of signals caused by differences in signal transmission distance among the wiring conductors, is a problem. An electronic component housing package based on one embodiment includes a substrate having a dielectric region and an electronic component placement region, a frame body surrounding the dielectric region and the placement region, and wiring conductors disposed on the dielectric region of the substrate. The wiring conductors have a first wiring conductor and a second wiring conductor which is longer in signal transmission distance than the first wiring conductor, which are disposed so as to extend from a location immediately below the frame body to the dielectric region. The frame body made of a dielectric material has a projection protruding from its inner periphery, which covers at least part of the first wiring conductor.

6 Claims, 5 Drawing Sheets

(51) Int. Cl.
*H01L 23/057* (2006.01)
*H01L 23/498* (2006.01)
*H05K 1/18* (2006.01)

(52) U.S. Cl.
CPC ............... *H05K1/024* (2013.01); *H05K 1/18* (2013.01); *H01L 2224/48091* (2013.01); *H01L 2924/3011* (2013.01); *H05K 2201/09336* (2013.01)

(56) References Cited

U.S. PATENT DOCUMENTS

| | | | |
|---|---|---|---|
| 5,070,041 A * | 12/1991 | Katayama et al. | 29/827 |
| 5,072,284 A * | 12/1991 | Tamura et al. | 257/680 |
| 5,122,861 A * | 6/1992 | Tamura et al. | 257/434 |
| 5,253,010 A * | 10/1993 | Oku et al. | 396/542 |
| 5,264,393 A * | 11/1993 | Tamura et al. | 438/64 |
| 5,268,533 A * | 12/1993 | Kovacs et al. | 174/562 |
| 5,315,153 A * | 5/1994 | Nagai et al. | 257/701 |
| 5,375,040 A * | 12/1994 | Cooper et al. | 361/730 |
| 5,471,011 A * | 11/1995 | Maslakow | 174/538 |
| 5,482,898 A * | 1/1996 | Marrs | 29/827 |
| 5,859,759 A * | 1/1999 | Moriyama et al. | 361/283.4 |
| 5,898,909 A * | 4/1999 | Yoshihara et al. | 455/73 |
| 6,294,839 B1 * | 9/2001 | Mess et al. | 257/777 |
| 6,905,261 B2 * | 6/2005 | Ishii et al. | 385/92 |
| 2006/0148318 A1 * | 7/2006 | Kuo | 439/607 |
| 2011/0293126 A1 * | 12/2011 | Maekawa et al. | 381/355 |
| 2011/0293128 A1 * | 12/2011 | Kuratani et al. | 381/361 |

FOREIGN PATENT DOCUMENTS

| | | |
|---|---|---|
| JP | 2004-134413 A | 4/2004 |
| JP | 2011-130395 A | 6/2011 |
| JP | 2011-243628 A | 12/2011 |

OTHER PUBLICATIONS

Japanese Office Action with English concise explanation, Japanese Patent Application No. 2013-550330, Sep. 8, 2015, 6 pgs.

* cited by examiner

ELECTRONIC COMPONENT HOUSING PACKAGE AND ELECTRONIC APPARATUS

TECHNICAL FIELD

The present invention relates to an electronic component housing package for accommodating an electronic component such as a semiconductor device, and an electronic apparatus. Such an electronic apparatus is used for electronic equipment of various types.

BACKGROUND ART

As an electronic component housing package for accommodating an electronic component (hereafter also referred to simply as "package"), for example, there is a package composed of a dielectric substrate having a plurality of signal lines formed in a radial arrangement on the upper surface thereof. The signal lines are connected, via a plurality of bonding pads, to an electronic component placed on the dielectric substrate.

CITATION LIST

Patent Literature

Patent Literature 1: Japanese Unexamined Patent Publication JP-A 9-275145 (1997)

SUMMARY OF INVENTION

Technical Problem

However, since a plurality of signal lines are arranged in a radial layout, the length of a centrally-located signal line and the length of an outwardly-located signal line differ from each other. In recent years, high frequency signal processing and highly integrated electronic components have been pursued. The larger the number of signal lines is, the greater a difference in length between the signal lines is. The difference of the length between the signal lines leads to a phase difference between signals propagating through their respective signal lines.

The invention has been devised in view of the problems as mentioned supra, and accordingly an object of the invention is to provide an electronic component housing package which avoids an increase in phase difference between signals even if a plurality of wiring conductors having different signal transmission distances are provided therein.

Solution to Problem

According to one aspect of the invention, an electronic component housing package comprises a housing main body composed of a substrate having a dielectric region made of a dielectric material and a placement region with an upper surface on which an electronic component is placed, and a frame body made of a dielectric material, which surrounds the dielectric region and the placement region. On the substrate are formed a first wiring conductor and a second wiring conductor which is longer in signal transmission distance than the first wiring conductor. The first wiring conductor and the second wiring conductor are disposed so as to extend from a location immediately below the frame body to the dielectric region, and conduct inputs and outputs of signals to the electronic component. In addition, the electronic component housing package is provided with a projection extending from the frame body, which covers at least part of the first wiring conductor.

Advantageous Effects of Invention

In the electronic component housing package in accordance with the above-described aspect of the invention, the first wiring conductor has a relatively short signal transmission distance compared to the second wiring conductor. The first wiring conductor is, at least partly, covered with the projection. In the part of the first wiring conductor covered with the dielectric-made projection, as compared to a non-covered part, a signal propagates at a lower speed. Therefore, there arises an increase in the amount of time required for signal transmission in the part of the first wiring conductor covered with the projection. This makes it possible to reduce a difference in signal transmission time between the first wiring conductor and the second wiring conductor, and thereby reduce a signal phase difference.

DESCRIPTION OF EMBODIMENTS

Figure 1:
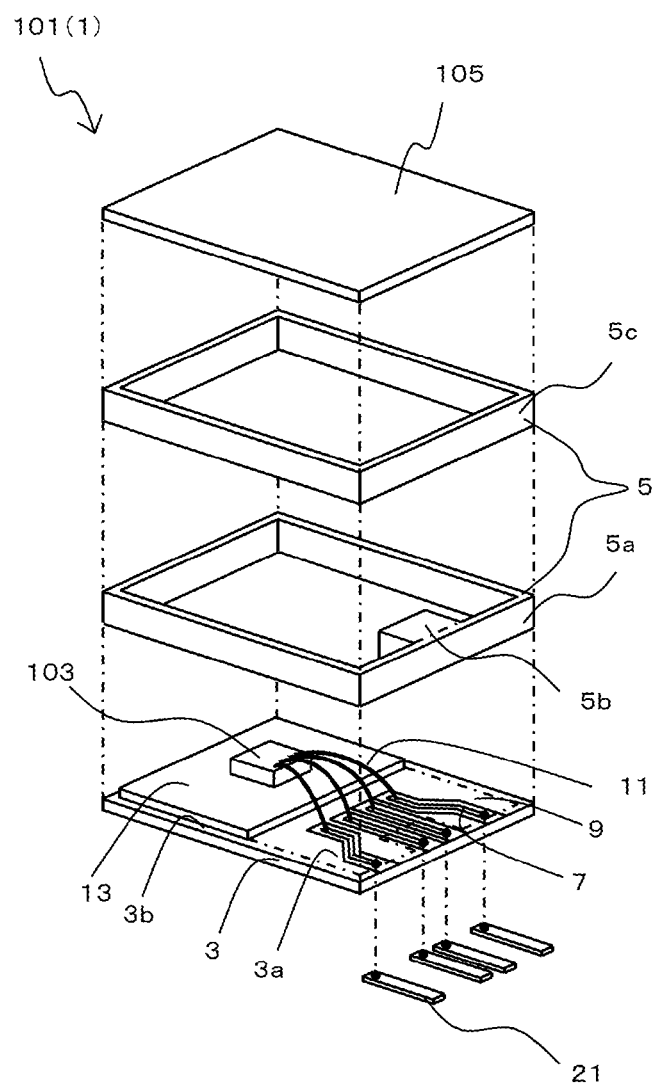
FIG. 1 is an exploded perspective view of an electronic component housing package and an electronic apparatus equipped with the electronic component housing package in accordance with a first embodiment.
Figure 2:
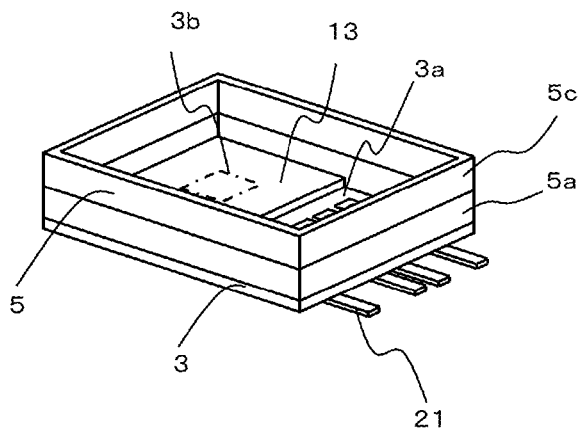
FIG. 2 is a perspective view of the electronic component housing package shown in FIG. 1.

Hereinafter, an electronic component housing package 1 (hereafter also referred to simply as "package 1") in accordance with embodiments of the invention and an electronic apparatus 101 equipped with the electronic component housing package 1 will be described in detail with reference to the drawings. Note that each drawing to be referred to in the following description shows the construction in simpler form than it actually is for the purpose of explanation of the invention. Accordingly, the package and the electronic apparatus pursuant to the invention may include any given constituent member which is not shown in each drawing to be referred to in this specification. Moreover, the scale of each drawing differs from the actualities.

In FIGS. 1 to 5B, there is shown a package of the first embodiment. The package 1 of the first embodiment comprises a housing main body composed of a substrate 3 and a frame body 5. The substrate 3 has a dielectric region 3a made of a dielectric material, and an electronic component placement region 3b which is adjacent to the dielectric region 3a. An electronic component 103 is placed on the upper surface of the placement region 3b. A frame body 5 is formed in upstanding condition around the upper surface of the substrate 3. The frame body 5 surrounds the dielectric region 3a and the placement region 3b. Additionally, the substrate 3 has, in its dielectric region 3a, a wiring conductor 7 and a ground conductor 9. Moreover, the electronic apparatus 101 of the first embodiment comprises: the above-described package 1; the electronic component 103 placed on the placement region 3b of the substrate 3; and a lid body 105 joined to the upper surface of the frame body 5.

The substrate 3 of the present embodiment is made of a rectangular dielectric material. Therefore, the substrate 3 of the present embodiment, in its entirety, constitutes the dielectric region 3a. Moreover, that part of the dielectric region 3a on which the electronic component 103 is placed is the placement region 3b. That is, the placement region 3b is part of the dielectric region 3a.

The placement region 3b refers to a region which lies in overlapping relation to the electronic component 103 when the substrate 3 is seen in a plan view. For example, the substrate 3 has a rectangular form which is 5 mm to 50 mm long, and 5 mm to 50 mm wide. Moreover, the thickness of the substrate 3 falls in the range of 0.3 mm to 3 mm, for example.

In the present embodiment, the placement region 3b is formed in a central portion of the upper surface of the substrate 3. The placement region 3b refers to a region where the electronic component 103 is placed. Therefore, for example, even if the placement region 3b is formed in an end part of the upper surface of the substrate 3, there arises no problem. Moreover, while the substrate 3 of the present embodiment has a single placement region 3b, the substrate 3 may be designed to have a plurality of placement regions 3b and so that the electronic component 103 is placed in each of the placement regions 3b.

Examples of the electronic component 103 to be placed on the upper surface of the substrate 3 include an optical semiconductor device, an IC (Integrated Circuit) element, and a capacitor. Examples of the optical semiconductor device include a light-emitting device typified by an LD (Laser Diode) element and a light-receiving device typified by a PD (Photodiode) element.

The electronic component 103 and the wiring conductor 7 are electrically connected to each other via, for example, a bonding wire 11. Transmission and reception of signals are effected between an external wiring circuit (not shown in the drawing) and the electronic component 103 via the bonding wire 11 and the wiring conductor 7. Since the placement region 3b is provided on the dielectric material, it follows that the electronic component 103 is kept in an insulated state by the substrate 3. In a case where the substrate 3 is made of metal or the like and thus the region where the electronic component 103 is placed is required to have high insulation properties, an insulating placement substrate 13 may be put on the substrate 3 and the electronic component 103 may be placed on this placement substrate 13.

As the dielectric material constituting the dielectric region 3a, for example, a ceramic material such as sintered aluminum oxide, sintered mullite, sintered silicon carbide, sintered aluminum nitride, and sintered silicon nitride may be used. A mixture is prepared by mixing raw material powder containing a dielectric material as above described, an organic solvent, and a binder. The mixture is shaped into sheets, thereby forming a plurality of ceramic green sheets. The thusly formed ceramic green sheets are stacked on top of each other to form a stacked body. By integrally firing the stacked body at a temperature of about 1600° C., the substrate 3 can be produced.

The substrate 3 is not limited to the construction of a stack of a plurality of sheets as above described, but may be made of a single sheet. Moreover, the substrate 3 may be given any form so long as it has the dielectric region 3a formed on its upper surface. For example, the substrate 3 may be constructed of a combination of a dielectric material and a metal member, and more specifically constructed by placing a dielectric material on part of the upper surface of a metal member. Especially in a case where the substrate 3 is required to have high heat-dissipation capability, it is preferable that the substrate 3 is constructed of a combination of a dielectric material and a metal member. This is because metal members generally have high heat conductivity.

Specifically, a material of metal such as iron, copper, nickel, chromium, cobalt, and tungsten, or an alloy made of such metals, or a composite material of such metals can be used for the metal member. The metal member constituting the substrate 3 can be produced by subjecting an ingot of such a metal material to metalworking process such as rolling process or stamping process.

The package 1 of the present embodiment includes the frame body 5 formed on the upper surface of the substrate 3 so as to surround the dielectric region 3a and the placement region 3b. The frame body 5 is divided into two parts, namely an upper part and a lower part. That is, the frame body 5 is composed of a first part 5a which is the lower part contacted by the upper surface of the substrate 3, and a second part 5c situated on the first part 5a. The first part 5a is shaped into a quadrangular frame as seen in a plan view, and has a projection 5b formed in part of its inner periphery so as to extend above the dielectric region 3a. The first part 5a is joined, through a joining member such as silver solder (not shown in the drawing), to the substrate 3. In a case where the substrate 3 and the first part 5a are both made of a dielectric material, the first part 5a, after being put on the upper surface of the substrate 3, may be integrally fired together with the substrate 3.

The second part 5c does not have the projection 5b as in the first part 5a. Each of the inner periphery and the outer periphery of the second part 5c is shaped into a quadrangular frame, so that the outer periphery overlaps the first part 5a when the second part 5c is seen in a plan view. Although the first part 5a and the second part 5c are illustrated as separate components in FIGS. 1 and 2 to simplify a visual understanding of the construction, this does not suggest any limitation.

For example, the first part 5a and the second part 5c may be made of a ceramic material such as sintered aluminum oxide or sintered aluminum nitride, and integrally fired. By virtue of the frame body 5, the rigidity of the package 1 can be enhanced, wherefore the package 1 becomes less prone to deformation under a force applied when the electronic apparatus 101 is mounted on an external mounting board (not shown in the drawing). Thus, for example, where the electronic apparatus 101 is of a type which effects inputting and outputting of optical signals via optical fibers, it is possible to avoid that the deformation of the package 1 will cause a deviation in the positional relationship between the optical-fiber installation location and the electronic component 103, which causes a decrease in optical-signal output.

Moreover, the second part 5c may be made of a metal material. In the case where the second part 5c is made of a metal material, for example, the second part 5c is joined to the first part 5a through a joining member such as silver solder (not shown in the drawing). The use of the second part 5c made of a metal material is advantageous in respect of improvement in heat-dissipation capability and the cooling of the electronic component 103. Note that there may be a case where the second part 5c is not used for the sake of making the package 1 lower in profile.

For example, the frame body 5 is 5 to 50 mm long and 5 mm to 50 mm wide when viewed in a plan view, is 0.5 to 2 mm in the width of the region between the outer periphery and the inner periphery, that is, in thickness, and is about 3 to 30 mm in height.

As is the case with the substrate 3, an insulating member or a metal member can be used for the frame body 5, excluding the projection 5b. As the insulating member, for example, a ceramic material such as sintered aluminum oxide, sintered mullite, sintered silicon carbide, sintered aluminum nitride, and sintered silicon nitride can be used. Moreover, as the metal member, for example, a material of metal such as iron, copper, nickel, chromium, cobalt, and tungsten, or an alloy made of such metal materials, or a composite member of such metal materials can be used.

Moreover, in the present embodiment, the projection 5b is made of a dielectric material. As the dielectric material constituting the projection 5b, as is the case with the substrate 3, for example, a ceramic material such as sintered aluminum oxide, sintered mullite, sintered silicon carbide, sintered aluminum nitride, and sintered silicon nitride can be used.

In the dielectric region 3a on the upper surface of the substrate 3, a plurality of wiring conductors 7 are formed through which high-frequency signals flow and the ground conductor 9. The wiring conductors 7 include a first wiring conductor 7a and a second wiring conductor 7b whose length is longer than that of the first wiring conductor 7a. Since the first wiring conductor 7a is formed in the place where the spacing between its ends is closer, the first wiring conductor 7a is shorter in length than the second wiring conductor 7b. Moreover, the second wiring conductor 7b is so shaped that the distance from the first wiring conductor 7a becomes longer gradually from the side toward the dielectric region 3a to the side toward the frame body 5, and that it has a bending portion. Therefore, the second wiring conductor 7b is longer in signal transmission distance than the first wiring conductor 7a.

In the dielectric region 3a, the ground conductors 9 are so disposed that each of the wiring conductors 7 is interposed between them. The ground conductors 9 disposed on both sides of the wiring conductor 7, and the wiring conductor 7 constitute a coplanar line, thereby high-frequency signals propagate along the wiring conductor 7 properly.

One end of each of the wiring conductors 7 is electrically connected to the electrode of the electronic component 103 via the bonding wire 11, for example. In a case where a plurality of wiring conductors 7 are led out to one of the four side walls constituting the frame body 5, since the electronic component 103 is narrower in width than the width of the side wall, it follows that the wiring conductors 7 are led out in a radial arrangement. This gives rise to a difference in length between the wiring conductors 7. The centrally-located wiring conductor 7a is led out in the shortest length, whereas the outwardly-located wiring conductor 7b has a longer path length. Thus, where the wiring conductors 7 have different lengths and consequently differ from each other in signal transmission distance, there is a possibility that a phase difference will be caused between signals propagating through their respective wiring conductors.

In the package 1 of the present embodiment, the projection 5b is disposed so as to cover at least part of the first wiring conductor 7a. As will be understood from FIGS. 1, 3 and 5A, the projection 5b covers a part of the first wiring conductor 7a which ranges from a point situated immediately below the frame body 5 to a point corresponding to a midpoint in the dielectric region 3a. In this way, the first wiring conductor 7a is sandwiched in part between the substrate 3 and the projection 5b. On the other hand, the second wiring conductor 7b is not covered with the projection 5b. The propagation speed of a high-frequency signal is decreased in the part of the first wiring conductor 7 covered with the projection 5b, as compared to non-covered regions, because of a higher ambient dielectric constant.

Accordingly, it is possible to reduce a difference between the time required for signal transmission in the first wiring conductor 7a and the time required for signal transmission in the second wiring conductor 7b, even if the second wiring conductor 7b is longer in signal transmission distance than the first wiring conductor 7a. That is, when signals are outputted from the first wiring conductor 7a and the second wiring conductor 7b to an external wiring circuit, a difference in high-frequency signal phase between the wiring conductors 7 can be reduced.

In this structure, in contrast to a case where a signal phase difference between the wiring conductors 7 is reduced by elongating the routing pattern of the wiring conductors 7, there is no need to secure a space for conductor routing. This helps increase the degree of freedom in the routing of the wiring conductors 7.

The thickness (height) of the projection 5b is set to be sufficiently greater than the wavelength of a high-frequency signal to obtain adequate permittivity-related advantageous effects from the projection 5b. For example, the thickness may be equal to the height of the frame body 5. Moreover, the projection 5b may be so shaped that its width becomes larger gradually from the side toward the dielectric region 3a to the side toward the frame body 5. In this case, the angle which the lateral side of the projection 5b forms with the inner periphery of the frame body 5 becomes an obtuse angle, with the consequent advantage of resistance to cracking and fracture. Furthermore, it is possible to combine the above-described method with a method for lengthening the signal transmission distance of the wiring conductor 7 by routing the wiring conductor 7 while bending it in the region covered with the projection 5b.

It is advisable that the projecting length of the projection 5b is determined in accordance with a difference in signal transmission distance between the first wiring conductor 7a and the second wiring conductor 7b. For example, where a sintered aluminum oxide having a dielectric constant of 9.4 is used for the dielectric region 3a, and likewise a sintered aluminum oxide having a dielectric constant of 9.4 is used for projection 5b, a signal transmission velocity V1 in the region covered with the projection 5b is given as about $9.8 \times 10^7$ m/s, whereas a signal transmission velocity V2 in the region which is not covered with the projection 5b is given as about $1.3 \times 10^8$ m/s.

For example, in the package 1 shown in FIGS. 1 to 5, the projecting length of the projection 5b is 3 mm. Given that a signal transmission distance L1 of the first wiring conductor 7a is 5.8 mm and a signal transmission distance L2 of the second wiring conductor 7b is 6.8 mm, then a length L11 of that part of the first wiring conductor 7a which is covered with the projection 5b is 3 mm, whereas a length L12 of that part of the first wiring conductor 7a which is not contacted by the projection 5b is 2.8 mm.

Therefore, if the frame body 5 is devoid of the projection 5b, a difference of an about 7.7×10-12 second (L2/V2−L1/V2) will be caused between signal transmission in the first wiring conductor 7a and signal transmission in the second wiring conductor 7b. By contrast, in the package 1 having the above-described structure, a difference in signal transmission between the first wiring conductor 7a and the second wiring conductor 7b (L2/V2−(L11/V1+L12/V2)) is an about 1.5× $10^{-13}$ second. Accordingly, a difference between the time for signal transmission in the first wiring conductor 7a and the time for signal transmission in the second wiring conductor 7b can be reduced to a level of about ⅕₀ with respect to the time difference of 7.7×$10^{-12}$ second as in the case where the projection 5b is not provided.

Figure 6:
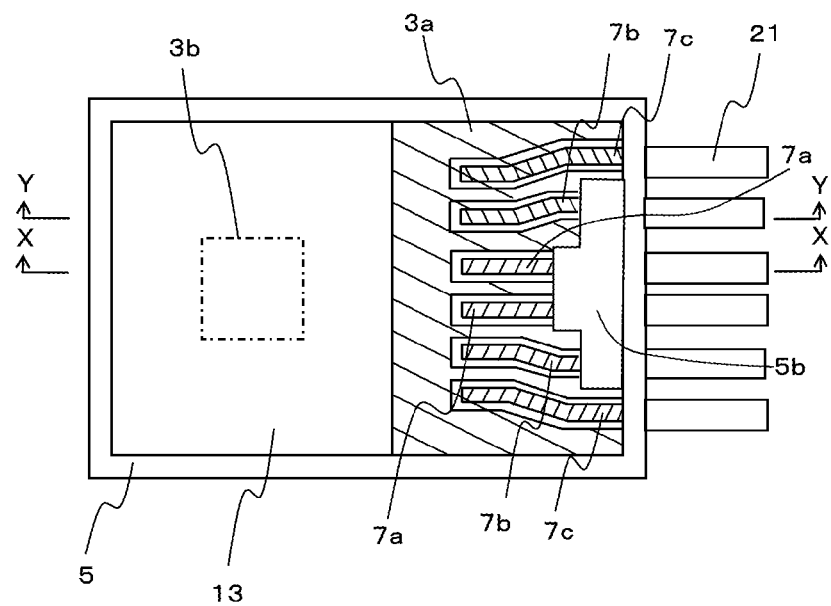
FIG. 6 is a plan view showing a modified example of the electronic component housing package shown in FIG. 3.
Figure 7A:
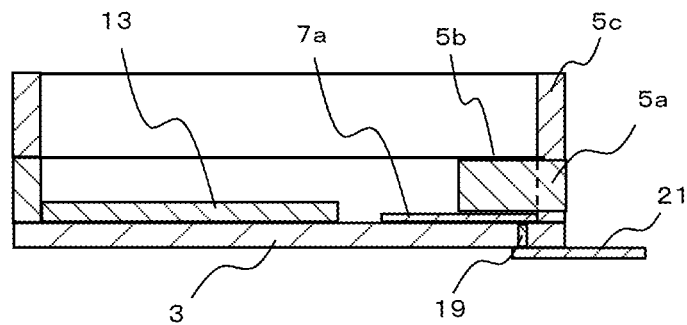
FIG. 7A is a sectional view of the electronic component housing package shown in FIG. 6 taken along the line X-X.
Figure 7B:
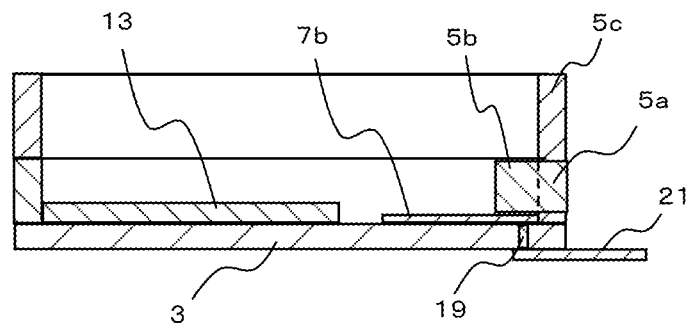
FIG. 7B is a sectional view of the electronic component housing package shown in FIG. 6 taken along the line Y-Y.

Although, in the package 1 shown in FIGS. 1 to 5, the projection 5b covers part of the first wiring conductor 7a but does not cover the second wiring conductor 7b, for example, as shown in FIGS. 6, 7A and 7B, the projection 5b may be designed to both cover part of the first wiring conductor 7a and part of the second wiring conductor 7b in a manner such that covered lengths of the first and second wiring conductors are different from each other.

In the package 1 shown in FIGS. 6, 7A and 7B, the length of the part of the first wiring conductor 7a covered with the projection 5b is longer than the length of the part of the second wiring conductor 7b covered with the projection 5b. This helps increase the substantial signal transmission distance of the first wiring conductor 7a. Note that FIG. 7(a) shows a section X-X of the part of the first wiring conductor 7a covered with the projection 5b, and FIG. 7(b) shows a section Y-Y of the part of the second wiring conductor 7b covered with the projection 5b.

Figure 3:
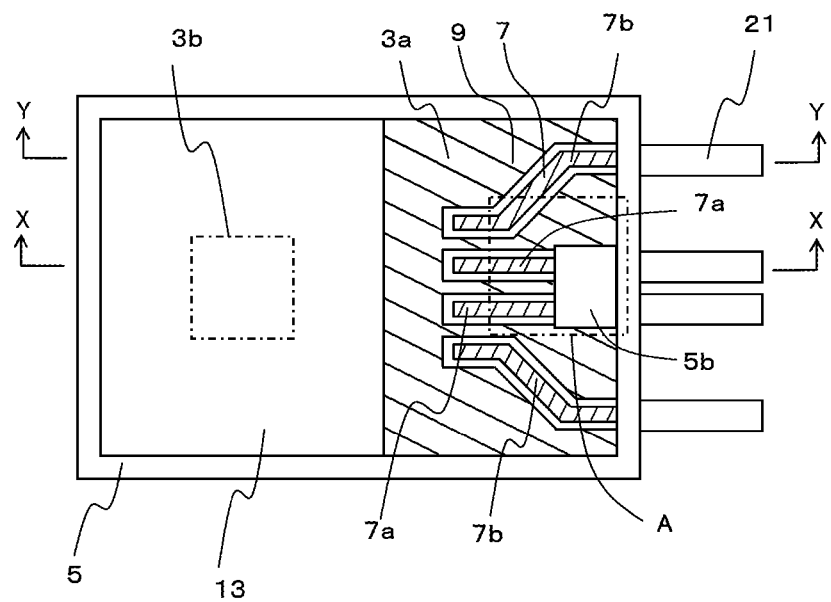
FIG. 3 is a plan view of the electronic component housing package shown in FIG. 2.
Figure 4:
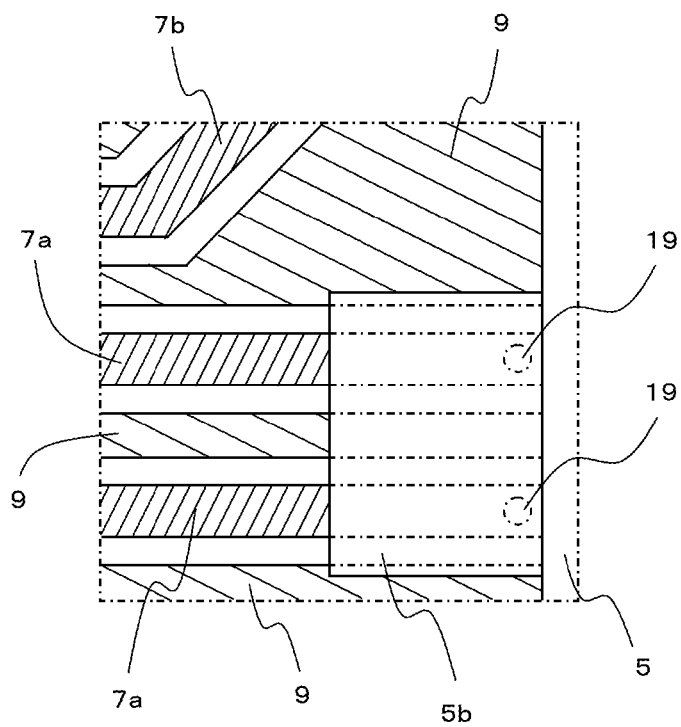
FIG. 4 is an enlarged plan view of the part "A" of the electronic component housing package shown in FIG. 3.
Figure 5A:
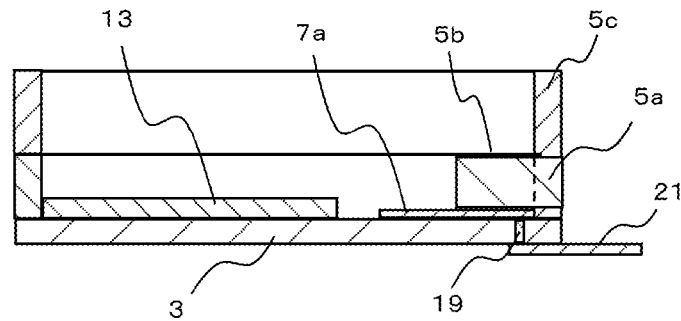
FIG. 5A is a sectional view of the electronic component housing package shown in FIG. 3 taken along the line X-X.
Figure 5B:
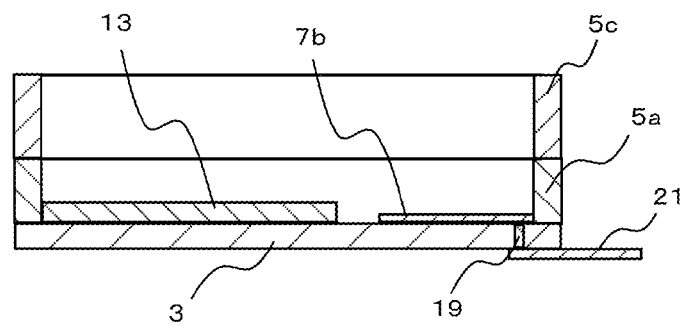
FIG. 5B is a sectional view of the electronic component housing package shown in FIG. 3 taken along the line Y-Y.

As practiced in the package 1 shown in FIG. 3 and the package 1 shown in FIG. 6, by configuring the projection 5b so as to differ in length between its parts for covering the first wiring conductor 7a and the second wiring conductor 7b having different lengths, respectively, it is possible to adjust signal transmission time. Note that the types of the wiring conductors 7 are not limited to those as shown in FIGS. 1 and 6. Even if the types of the wiring conductors 7 having different lengths are increased, it does not matter so long as the length covered with the projection 5b is adjusted in a similar manner.

As the wiring conductor 7 and the ground conductor 9, in the interest of reduction in signal transmission loss, it is desirable to use members having excellent electrical conductivity. Specifically, a metal material such for example as tungsten, molybdenum, nickel, copper, silver, and gold can be used.

In the package 1 of the present embodiment, the wiring conductor 7 is connected to a via-conductor 19 disposed in a through hole drilled all the way through from the upper surface to the lower surface of the substrate 3, so that the wiring conductor 7 can be led out to the lower-surface side of the substrate 3 via the via-conductor 19. The lower end of the via-conductor 19 is connected to a lead terminal 21, and the lead terminal 21 is connected to an external wiring circuit. Thus, the electronic component 103 effects inputting and outputting of signals between itself and the external wiring circuit via the wiring conductor 7, the via-conductor 19, the lead terminal 21, and so forth.

A highly electrically conductive metal is used for the via-conductor 19 and the lead terminal 21. Moreover, although the package 1 of the present embodiment adopts the connecting method using the via-conductor 19 and the lead terminal 21, this connecting method is merely one example and therefore does not suggest any limitation.

The electronic apparatus 101 employing the package 1 of the present embodiment includes the lid body 105 joined to the frame body 5. The lid body 105 is so disposed as to seal the electronic component 103 and so forth housed inside the package 1. The lid body 105 is joined to the upper surface of the frame body 5. By sealing the electronic component 103 in this way, it is possible to protect the electronic component 103 during long-term use of the package 1.

As the lid body 105, for example, a metal member such as iron, copper, nickel, chromium, cobalt, and tungsten, or an alloy made of such metal members can be used. Moreover, the frame body 5 and the lid body 105 may be joined to each other with use of a gold-tin brazing material, for example.

Moreover, the frame body 5 and the lid body 105 may either be joined directly to each other or be joined to each other, with a ring-shaped metal member, or a so-called seal ring, interposed between them so as to overlap the frame body 5 as seen in a plan view, for example. In a case where the second part 5c is made of metal, the second part 5c can be used as the seal ring.

The package 1 of the first embodiment thus far described is, as exemplified, designed so that the frame body 5 has the projection 5b and the projection 5b covers part of the first wiring conductor 7a. Alternatively, instead of using the projection 5b which is formed integrally with the frame body 5, it is possible to use a dielectric member as a separate component. In this case, the dielectric member may be joined to the dielectric region 3a of the substrate 3, with part of the first wiring conductor 7a sandwiched between them. Just as in the case of using the projection 5b, the use of a dielectric member which is identical in shape with the projection 5b also makes it possible to achieve phase matching between signals flowing through their respective wiring conductors 7.

Figure 8:
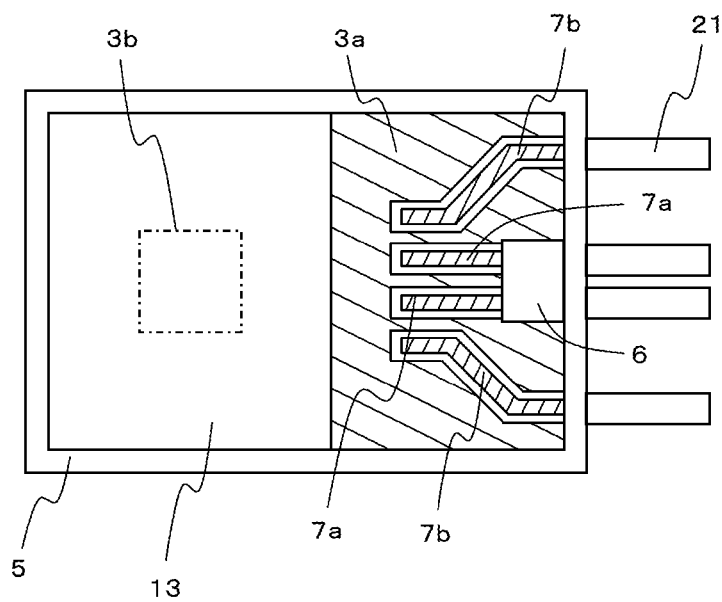
FIG. 8 is a plan view of the electronic component housing package in accordance with a second embodiment.
Figure 9A:
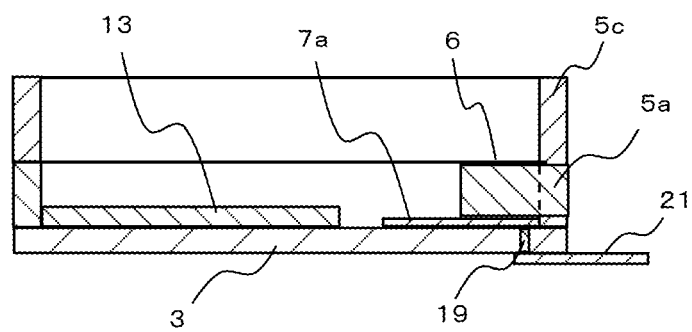
FIG. 9A is a sectional view of the electronic component housing package shown in FIG. 8 taken along the line X-X.
Figure 9B:
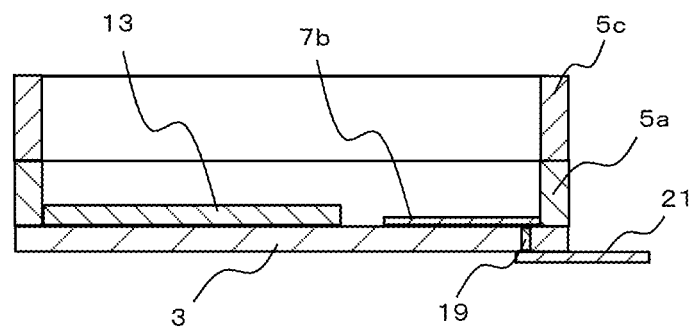
FIG. 9B is a sectional view of the electronic component housing package shown in FIG. 8 taken along the line Y-Y.

FIG. 8 shows a case where a dielectric member 6 is used instead of the projection 5b. The dielectric member 6 and the frame body 5 are constructed of separate components. In this case, the first part 5a of the frame body 5 and the dielectric member 6 can be made of different materials without difficulty. For example, the dielectric member 6 can be made of sintered aluminum oxide, whereas the first part 5a can be made of metal.

It is preferable that the dielectric member is disposed in contact with the inner periphery of the frame body 5. If there is a gap between the dielectric member and the frame body 5, a change in impedance will occur in the gap, which may result in high-frequency signal transmission loss.

Up to this point the embodiments of the electronic component housing package and the electronic apparatus employing the electronic component housing package have been described. However, the invention is not limited to the embodiments described hereinabove. That is, various changes, modifications, and combinations of the embodiments are possible without departing from the scope of the invention.

REFERENCE SIGNS LIST

1: Electronic component housing package (package)
3: Substrate
   3a: Dielectric region
   3b: Placement region
5: Frame body
   5a: First part
   5b: Projection
   5c: Second part 6: Dielectric member
7: Wiring conductor
   7a: First wiring conductor
   7b: Second wiring conductor
9: Ground conductor
11: Bonding wire
13: Placement substrate
19: Via-conductor
21: Lead terminal
101: Electronic apparatus
103: Electronic component
105: Lid body

The invention claimed is:

1. An electronic component housing package, comprising:
a housing main body composed of a substrate having a dielectric region made of a dielectric material and a placement region with an upper surface on which an electronic component is placed, and a frame body made of a dielectric material, which surrounds the dielectric region and the placement region;
a first wiring conductor and a second wiring conductor which is longer in signal transmission distance than the first wiring conductor, which are disposed on the dielectric region so as to extend from a location immediately below the frame body, and conduct inputs and outputs of signals to the electronic component; and
a projection made of a dielectric material and extending from the frame body, which covers at least part of the first wiring conductor, and the second wiring conductor having a part that is not covered by the dielectric material; and
wherein a length of the second wiring conductor not covered with the dielectric material is longer than a length of a part of the first wiring conductor not covered with the projection.

2. The electronic component housing package according to claim 1,
wherein part of the first wiring conductor and part of the second wiring conductor are both covered with the projection, and
wherein the part of the first wiring conductor covered with the projection is longer in signal transmission distance than the part of the second wiring conductor covered with the projection.

3. The electronic component housing package according to claim 1,
wherein the projection is composed of a dielectric member provided as a separate component from the frame body.

4. An electronic apparatus, comprising:
the electronic component housing package according to claim 1; and
an electronic component placed on the placement region of the electronic component housing package so as to be connected to the first wiring conductor and the second wiring conductor.

5. The electronic component housing package according to claim 1,
wherein part of the first wiring conductor covered with the projection is longer in signal transmission distance than part of the second wiring conductor covered with the projection.

6. The electronic component housing package according to claim 1,
wherein the projection is so shaped that its width becomes larger gradually from the dielectric region toward the frame body.

* * * * *